United States Patent [19]
Komano et al.

[11] Patent Number: 5,807,650
[45] Date of Patent: Sep. 15, 1998

[54] PHOTO MASK AND APPARATUS FOR REPAIRING PHOTO MASK

[75] Inventors: Haruki Komano; Hiroko Nakamura; Munehiro Ogasawara, all of Kanagawa-ken; Satoshi Masuda, Tokyo; Katsuya Okumura; Yoji Ogawa, both of Kanagawa-ken, all of Japan

[73] Assignee: Kabushiki Kaisha Toshiba, Kawasaki, Japan

[21] Appl. No.: 914,809

[22] Filed: Aug. 20, 1997

Related U.S. Application Data

[63] Continuation of Ser. No. 638,863, Apr. 29, 1996, abandoned, which is a continuation of Ser. No. 439,894, May 22, 1995, abandoned, which is a continuation of Ser. No. 38,683, Mar. 23, 1993, abandoned.

[30] Foreign Application Priority Data

Mar. 24, 1992 [JP] Japan ................................. 4-066355
May 22, 1992 [JP] Japan ................................. 4-130304
Jun. 22, 1992 [JP] Japan ................................. 4-163039

[51] Int. Cl.⁶ ................................................ G03F 9/00
[52] U.S. Cl. .......................................................... 430/5
[58] Field of Search ................................. 430/5, 323, 324; 156/625, 643; 204/192.34

[56] References Cited

U.S. PATENT DOCUMENTS

| 5,035,787 | 7/1991 | Parker et al. | 204/192 |
|---|---|---|---|
| 5,085,957 | 2/1992 | Hosono | 430/5 |
| 5,208,125 | 5/1993 | Lowrey et al. | 430/5 |
| 5,217,830 | 6/1993 | Lowrey | 430/5 |
| 5,358,806 | 10/1994 | Haraichi et al. | 430/5 |
| 5,439,763 | 8/1995 | Shimase et al. | 430/5 |

FOREIGN PATENT DOCUMENTS

| 63-301952 | 7/1988 | Japan . |
|---|---|---|
| 4-50844 | 4/1992 | Japan . |

OTHER PUBLICATIONS

Extended Abstracts (The 51st Autumn Meeting, Mar. 1990); The Japan Society of Applied Physics No. 2.

*Primary Examiner*—S. Rosasco
*Attorney, Agent, or Firm*—Finnegan, Henderson, Farabow, Garrett & Dunner, L.L.P.

[57] ABSTRACT

A method of repairing a defect existing on a photo mask comprising a transparent substrate and a mask pattern formed on the substrate, comprises steps of irradiating a focused ion beam toward the defect and supplying $XeF_2$ gas to the defect, when an etching rate of the defect by the focused ion beam and $XeF_2$ is 1.7 times greater than an etching rate by a sole irradiation of the focused ion beam.

39 Claims, 13 Drawing Sheets

$m = (2n-1) - t$
n: NATURAL NUMBER $k = 2nt$
n: NATURAL NUMBER $m-(2n-1)t$
n: NATURAL NUMBER

PHOTO MASK AND APPARATUS FOR REPAIRING PHOTO MASK

This application is a continuation of application Ser. No. 08/638,863, filed Apr. 29, 1996, which is a continuation of application Ser. No. 08/439,894, filed May 22, 1995, which is a continuation of application Ser. No. 08/038,683, filed Mar. 23, 1993, all now abandoned.

BACKGROUND OF THE INVENTION

1. Field of the Invention

The present invention relates to a photo mask, and more particularly, to a phase shifting photo mask. In addition, the present invention relates to a method for repairing a photo mask, and particularly, to a method for repairing a phase shifting photo mask.

2. Description of the Related Art

Recently, as semiconductor integrated circuits become denser and more miniaturized, high resolution of a mask pattern has been obtained by developing a method of exposure, a resist material, or an improvement of a resist process. An improvement for a photo mask has also been developed. The photo mask has a substrate that is transparent to an exposure light and has a mask pattern formed on the substrate. When the size of the mask pattern becomes very small, a transmitted light from the pattern is not resolved because of an effect of the adjacent pattern.

To solve this problem, a phase shifting method has been developed. According to the method, the resolution and the contrast of the projection image can be improved by controlling the exposure light transmitted through the mask pattern. That is, as shown in FIG. 1(a), a phase shift layer or a shifter 700 is formed, for example, on a part of a transparent substrate 702, and between two adjacent patterns 704a . . . 704b, in order to remove the effect of diffraction from a mask pattern to another mask pattern and to improve the pattern accuracy. An amount of phase shifting of the light through the edge portion of the mask is designed to be 180°. By introduction of the method, a conventional process, such as a stepper apparatus, or a resist process, can be used without any changes to improve a resolving power and a depth of focus. When the phase shift mask is used, however, a small defect of the shifter, which is negligible in a conventional mask, is projected on the wafer. Accordingly, the defect must be repaired.

FIG. 1(a) shows a convex defect 706a on a mask. FIG. 2(a) shows a concave defect 706b. Conventionally, the convex defect formed on a non-phase shift mask has been repaired by evaporating the defect using a laser, and the concave defect has been repaired by depositing a carbon layer on a portion of the concave defect to shut off the exposure light. The deposition is carried out by a focused ion beam (FIB) assisted deposition.

With regard to the phase shifting mask, however, in a convex defect 706a shown in FIG. 1(a) or a concave defect 706b shown in FIG. 2(a), the defects to be repaired are very small and therefore a precision of pattern size cannot be attained by the laser. The defect concerned with the phase shift layer shifts phase from 180° for the exposure light through the defect. Accordingly, a normal pattern cannot be projected on the wafer.

Because defect of the phase shifter deteriorates the yield of manufacturing to less than 25%, a technology to repair a phase shifter is required.

A method of repair by a focused ion beam (FIB) has recently been proposed. By using the FIB method, the convex defect can be repaired by removing the defect, as shown in FIG. 1(b). The concave defect, as shown in FIG. 2(b), can be repaired by etching the transparent substrate to reach a depth which can obtain a desired phase. However, because the FIB uses a liquid metal ion source, damage is generated by implantation of metal ions. Therefore, a transmission factor of the phase shifter decreases.

To recover the transmission, a method of etching the damaged layer by $CF_4$ or $CHF_3$ plasma has been proposed. But according to the method, a mask is etched, so a reflection preventing layer, which is usually formed on the mask pattern, is etched at the same time and a corner portion of the pattern is relatively quickly etched. Therefore, an angle of the mask pattern is deteriorated. In the case of a concave defect, to avoid the deterioration of the transmission, a light transmitting layer can be selectively deposited into the defect without any etching. However, it is very difficult to deposit the light transmitting layer, which has a transmission of more than 90% and a reflective index similar to that of the phase shifter. For example, it is possible to deposit a silicon oxide layer as the light transmitting layer by using a 60 KeV focused silicon ion beam, but this obtains a transmission factor of at most about 30%.

Accordingly, this method is not used in repairing a concave defect of the phase shift mask.

Moreover, in a focused ion beam etching, because a defect depth of the shifter is unknown, an end point of etching cannot easily be determined simply by an ion irradiating time in consideration of an etching rate.

Also, if a surface of the quartz substrate can be detected by etching the phase shifter, the etching depth of the substrate is determined by the ion irradiating time. But, when a silicon oxide layer is used as a phase shifter, a detection of the surface of the substrate is impossible because the substrate is usually comprised of the same chemical elements, e.g., Si, O, as the phase shifter.

Thus, in repairing a defect of a phase shifter, a focused ion beam etching cannot detect an end point of etching and cannot achieve highly accurate repair.

SUMMARY OF THE INVENTION

A first object of the present invention is to provide a method of repairing a phase shift mask that does not cause a deterioration of a transmission of the phase shifting mask.

A second object of the present invention is to provide a method of repairing a phase shifting mask which repairs a deterioration of a transmission.

A third object of the present invention is to provide a method of repairing a concave defect of a phase shifting mask by a selective deposition under a satisfactory transmission.

A fourth object of the present invention is to provide a phase shifting mask which can easily be detected at an end point in etching and can be repaired with high accuracy.

A fifth object of the present invention is to provide a phase shifting mask where a transmission of the phase shifting mask is not decreased after repair.

To attain the first object of the invention, there is provided a method of repairing a defect existing on a photo mask, comprising a transparent substrate and a mask pattern formed on the substrate, comprising the steps of: irradiating a focused ion beam toward the defect; and supplying $XeF_2$ gas to the defect, under a condition that an etching rate of the defect by the focused ion beam and the $XeF_2$ gas is 1.7 times greater than an etching rate by a sole irradiation of the focused ion beam.

To attain the second object of the invention, there is provided a method of repairing a defect existing on a photo mask having a transparent substrate and a mask pattern formed on the substrate, comprising the steps of: irradiating a focused beam to remove the defect; and supplying an etching gas for etching a damaged surface of the transparent substrate with the irradiation of the focused ion beam.

To attain the third object of the invention, there is provided a method of repairing a concave defect existing on a photo mask having a transparent substrate and a mask pattern formed on the substrate, comprising the steps of: irradiating a focused ion beam toward the concave defect, with an accelerated energy less than 10 keV at the surface of the mask; and supplying a deposition gas to the concave defect to form a deposition layer in the defect.

To attain the fourth object of the invention, a photo mask comprises: a transparent substrate having a primary surface; a phase shifter, which is made of a same material as the transparent substrate and is formed on the transparent substrate and which phase shifts in response to an exposure light used for the photo mask; and an ion implanted layer formed at the primary surface and being formed of a different material than the transparent substrate.

To attain the fifth object of the invention, a photo mask comprises: a transparent substrate; a half-transparent layer formed on the substrate by injecting ions into the substrate until a transmission becomes a constant; and a mask pattern formed on the half-transparent layer.

BRIEF DESCRIPTION OF THE DRAWINGS

The other objects and advantages of the invention will be apparent from the following description, taken in conjunction with the accompanying drawings, in which.

DETAILED DESCRIPTION OF THE PREFERRED EMBODIMENTS

A method of repairing a phase shifting mask according to a first embodiment of the present invention will be explained below in detail.

In this first embodiment, a phase shifting mask having a phase shifter made of a silicon oxide layer is described.

Figure 1A:
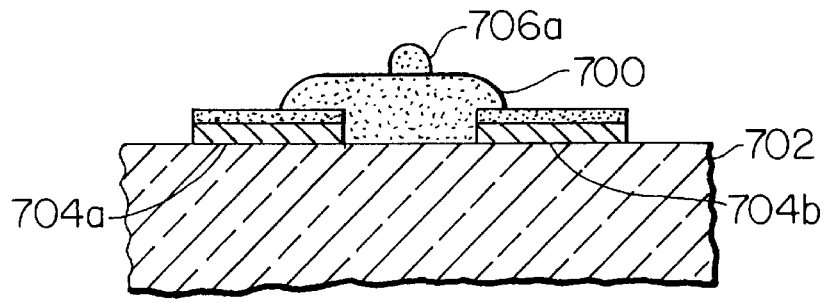
FIGS. 1(a) and 1(b) are sectional views to explain conventional methods of repairing a photo mask.
Figure 1B:
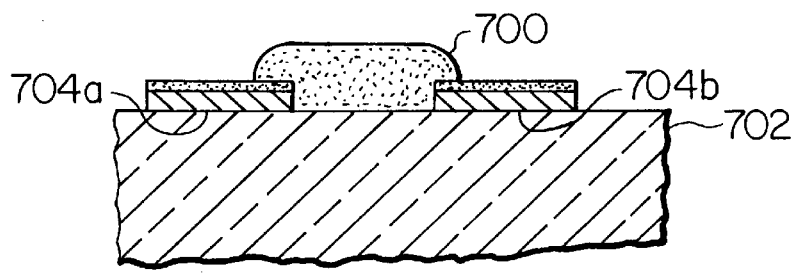
Figure 2A:
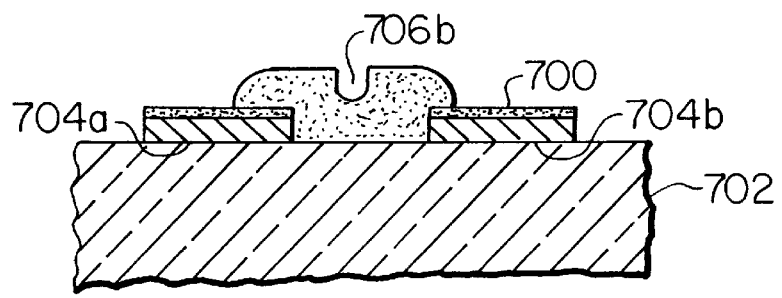
FIGS. 2(a) and 2(b) are sectional views to explain conventional methods of repairing a photo mask.
Figure 2B:
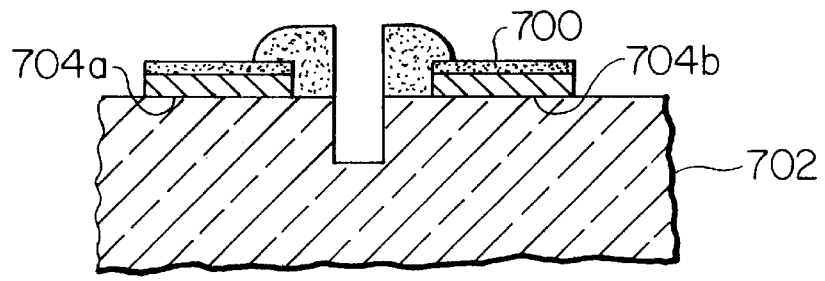
Figure 3A:
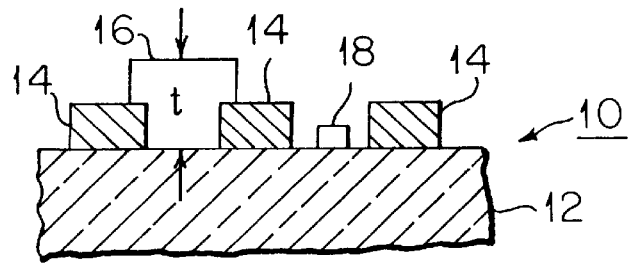
FIGS. 3(a), 3(b), and 3(c) are sectional views of photo masks of the present invention.

As shown in FIG. 3(a), a phase shifting mask 10, which is a so-called, Levenson-type phase shifting mask, comprises a quartz substrate 12 (where a transparent substrate Cr mask patterns 14 are formed on substrate 12), and a silicon oxide phase shifter 16 is formed adjacent to the mask pattern. A convex defect 18 is formed on a transparent substrate 12 between two mask patterns 14. A thickness t of a phase shifter 16, which is important to a phase inversion, is an uneven multiple of $\lambda/(2n-1)$ (where A is a wavelength of a light source and n is a refractive index of a phase shifter). Practically, a ±5% error of the value is allowed.

In the first embodiment, the phase shifter 16 is made by a method of liquid phase deposition. This method has advantages that the thickness of the shifter 16 is easily controlled and a good quality of a high density of the shifter 16 can be obtained. The light source is a KrF excimer laser. Here, a measured value of n is 1.474, so the wavelength is set to 261.6 nm. If a wavelength of 365 nm is used, n would be 1.445. In the described embodiment, an actual wavelength is set to 410.1 nm. The phase shifter 16 also could be a spin on glass (SOG) layer, instead of the layer formed by the liquid phase deposition.

Figure 3B:
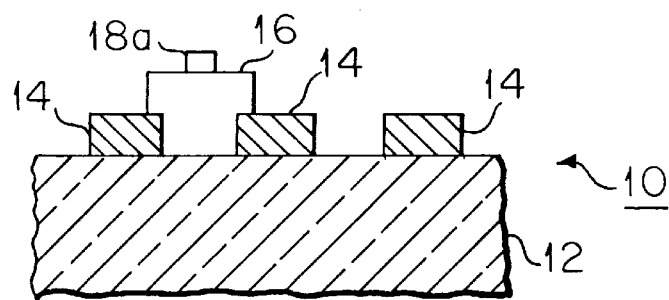
Figure 3C:
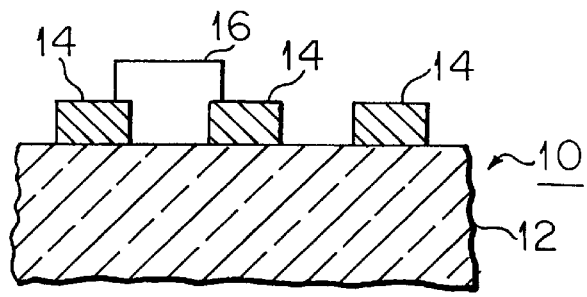
Figure 4:
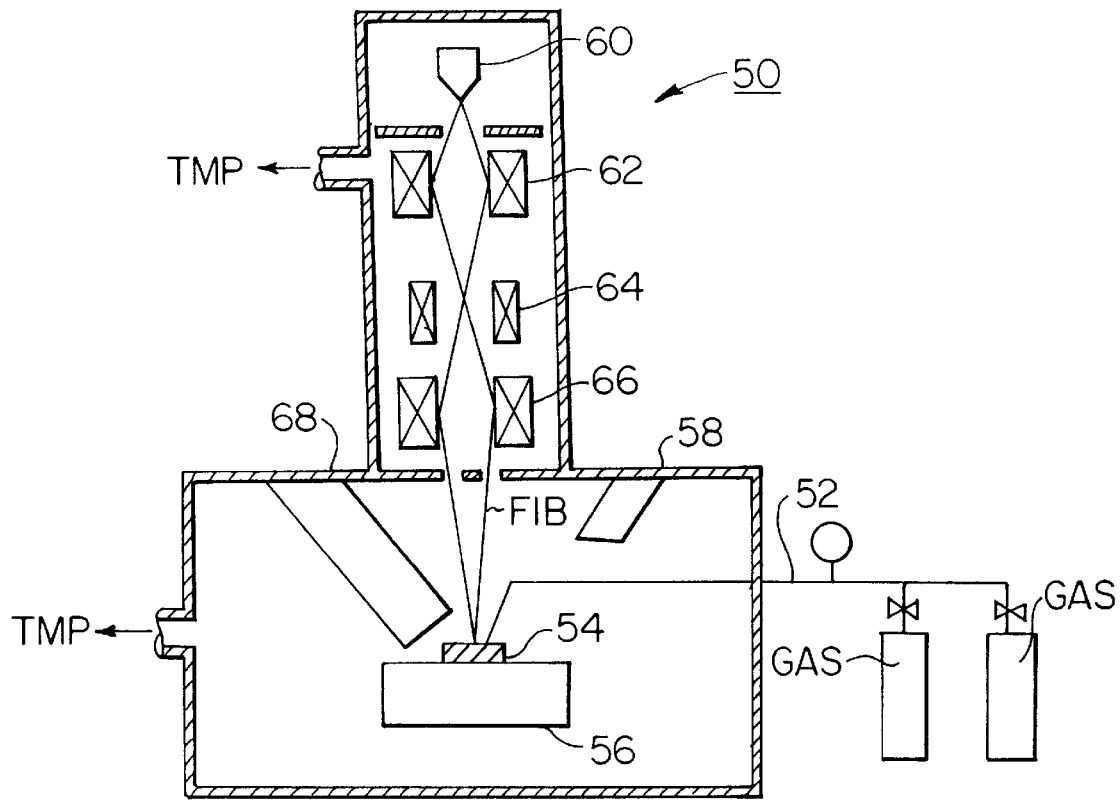
FIG. 4 is a schematic sectional view of a focused ion beam apparatus used in the present invention.

Convex defect 18, which was formed during formation of the phase shifting mask, is removed by using a focused ion beam apparatus shown in FIG. 4 to obtain a defect-free mask 10 shown in FIG. 3(c).

Another type of a convex defect 18a (see FIG. 3(b) formed on the phase shifter 16 can also be removed by the same removal method. An apparatus 50, shown in FIG. 4, has a gas introducing nozzle 52. A mask 54, such as shown in FIG. 3(a) or FIG. 3(b), is placed on a stage or a holder 56 in a chamber 58. An ion beam FIB is irradiated from an ion source 60 to the mask 54, controlled by an optical system such as a condenser lens 62, a deflector 64, and an objective lens 66. The ion beam is focused into the defect 18 or 18a of a mask 54 through such an optical system. An etching gas, for example $XeF_2$, is supplied from a gas introducing nozzle 52 at the same time, in order to carry out focused ion beam assisted etching.

In this etching, a gas pressure at a back end of the nozzle 52 is held at 1.0 Torr and a tip of nozzle 52 is extended nearly to a portion of the defect 18 or 18a.

The ion source 60, made of Ga liquid metal, has 30 KV of accelerated voltage and 110 pA of beam currents applied thereto.

An end point of the etching is made as follows. First, a configuration and a light of the defect 18 or 18a is observed and measured by a laser microscope, a region of the defect 18 or 18a is divided into small regions and an amount of beam irradiation is determined for each small region by considering an etching rate of the shifter 16. According to these steps, the end point is determined.

For example, the defects 18 and 18a in FIG. 3(a) and FIG. 3(b) both have a 0.8 μm square size and a thickness of 261.6 nm. The etching rate of the shifter 16, which is made by liquid phase deposition, is 14.5 nm for one scan of the ion beam. Accordingly, 18 scans are made.

As a result, spontaneous etching of a mask pattern 14 and a transparent substrate 12 does not occur and the etching is made into a portion where the ion beam was irradiated.

In a conventional sputter etching by a Ga ion beam, a transmission after a removal of a convex defect is decreased to 60%, in a case of using a 248 nm of exposure light. Therefore, in an experiment to project the mask to a substrate by using a nega-type resist film, the resist where an exposure light was irradiated through the mask was resolved.

In the first embodiment of the present invention, however, the etching rate of the defect 18 or 18a is 100 times the conventional sputter etching and an injected Ga layer is quickly removed. Accordingly, a decrease of the transmission, based on the injected Ga ions is suppressed and a 99% of transmission obtained. Also, the defect is not projected on a resist formed on the wafer and a fine resist pattern can be attained.

Figure 5A:
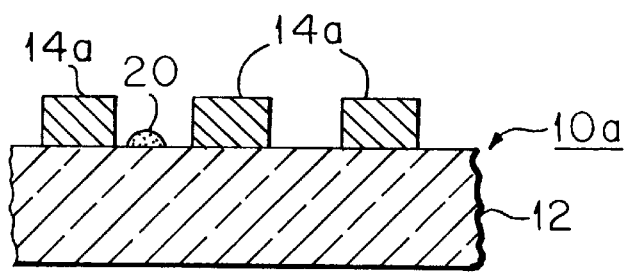
FIGS. 5(a) and 5(b) are sectional views of photo masks of the present invention.

A second embodiment of the present invention will be described below. The second embodiment is a method for repairing a photo mask 10a having a defect 20 made of a mask material, such as Cr. As shown in FIG. 5(a), mask patterns 14a made of a Cr layer are formed on a quartz substrate 12 and a small defect 20 having, e.g., a 5 μm square size and a thickness of 70 nm, is located between two mask patterns 14a on a substrate 12. A 30 nm reflection preventing layer (not shown in the figure) is formed on mask patterns 14a to overwrap the surface of mask patterns 14a.

A focused ion beam apparatus, shown in FIG. 4, was used for repairing the defect of a photo mask 10a.

First, a position of a defect 20 is checked through a SIM image obtained by irradiating a focused ion beam into a surface of a photo mask 10a as a substrate 54 in FIG. 4.

Next, $XeF_2$ gas as an etching gas is introduced to a substrate 54 such that a gas pressure at a back end gas introducing nozzle 52 is set to 0.2 Torr. A focused ion, e.g., Ga, beam having a 30 KV acceleration and a 400 pA beam current is irradiated to the substrate 54. An etching rate of a quartz substrate 54 is about 1.7 times greater than that of sputter etching.

Figure 5B:
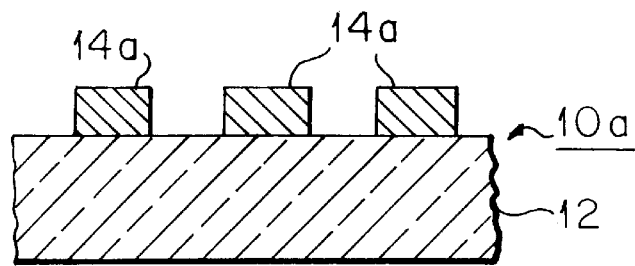

When the focused ion beam is irradiated to a defect 20, the Cr defect 20 is removed, as shown in FIG. 5(b), by a sputter etching phenomenon, but an enhanced effect (or an accelerated effect) by focused ion beam assisted etching with $XeF_2$ gas is not observed.

An end point detection of this etching is monitored from Cr ions, by using a channel plate 68.

Thus, according to the second embodiment, a repaired photo mask without a decrease of a transmission can be obtained.

Next, by changing an $XeF_2$ gas flow, a change of the transmission against an enhanced rate of etching, which is defined by (an etching rate using $XeF_2$)/(an etching rate without $XeF_2$ gas), is achieved.

Figure 6:
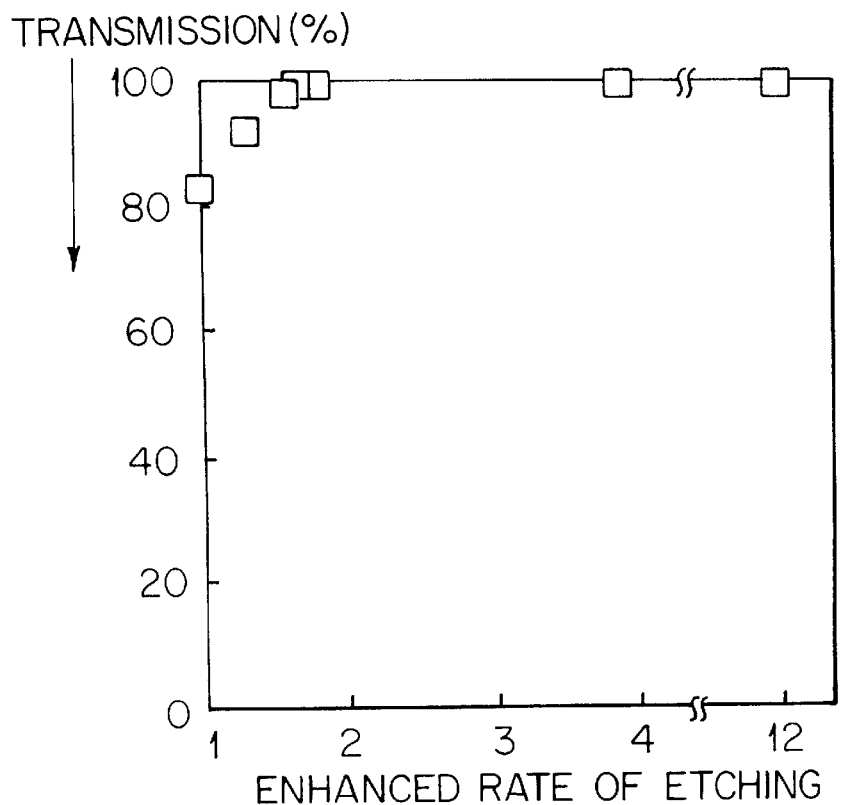
FIG. 6 is a graph which shows a relationship between an enhanced rate of etching and a transmission.

As a result, as shown in FIG. 6, if a small amount of $XeF_2$ gas is used, where the enhanced rate of etching is 1.7 times as much as the etching rate, a decrease of the transmission is suppressed.

Moreover, by changing the gas pressure, a dependency of etching rate by materials can be reduced along with a decrease in the etching rate. Therefore, an overetching by exposing a surface of the substrate can be suppressed.

Figure 7A:
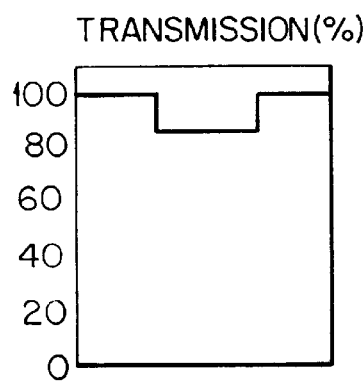
FIGS. 7(a), 7(b) and 7(c) are graphs which show changes of transmission according to gas pressure.
Figure 7B:
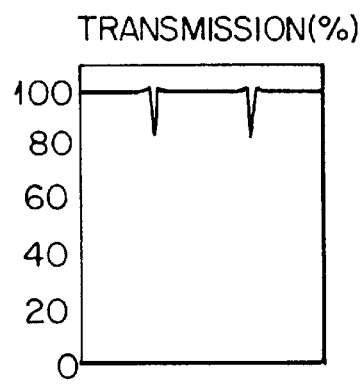
Figure 7C:
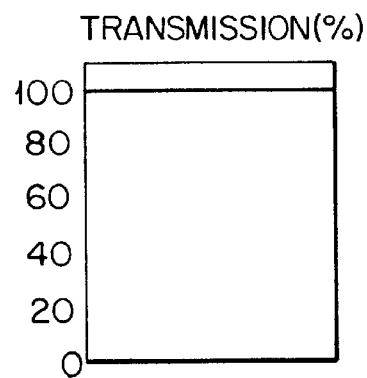

FIG. 7(a) to FIG. 7(c) show a result of a measurement for changes of a transmission, after the defect has been removed by changing a gas pressure at the nozzle. FIG. 7(a) shows a result of irradiating a focused ion beam without any etching gas. FIG. 7(b) shows a result of irradiating a focused ion beam with 1.0 Torr of etching gas. FIG. 7(c) shows a result of irradiating a focused ion beam with 0.2 Torr of etching gas.

Figure 8:
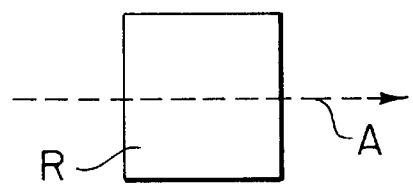
FIG. 8 is a plan view to explain an experiment.

Each figure shows a transmission of a repaired region R by a g line, measured by scanning a slit on the region R along with an arrow A, as shown in FIG. 8.

As is apparent from a comparison of FIGS. 7(a)–7(c), in a case without $XeF_2$, the transmission was decreased to 83% when an exposure experiment was made using a 1.2 μm thick resist (PFX-IX500) and a i7A stepper (NA=0.5, σ=0.6), a part of resist remained at the repaired region.

In a case using a 1.0 Torr of $XeF_2$ gas, an etching rate of a quartz substrate 10 was eleven times faster than an etching rate of Cr. Accordingly, when the quartz substrate is exposed, the surface of the substrate is etched quickly and deeply, after stopping the irradiation at the endpoint of etching. Therefore, as shown in FIG. 7(b), a dark portion was observed at the edge of the resist R. When an exposure experiment by an i line was made, a part of the resist remained at the edge.

However, in a case using a 0.2 Torr of $XeF_2$ gas, an etching rate was not as fast as that of the previous case. Therefore, a deep overetch of the surface was not observed. Accordingly, as shown in FIG. 7(c), neither a dark portion nor a decrease of a transmission was observed.

Moreover, any undesired resist did not remain in any exposure experiment using this repaired mask.

In the second embodiment, an enhanced etching rate of more than 1.7 causes a high transmission. An upper limit of the enhancing factor would be changeable, based on exposure conditions. However, if the factor is more than 1.7 and less than 3, an undesired remaining resist was not observed.

In the above embodiments, a Cr layer was used as a mask pattern, but other mask patterns, e.g., MoSi, could be used.

Also, the invention can be used for repairing a phase shifting mask. The mask pattern of the phase shifting mask is almost the same as the above embodiment and this manner is effective to repair a convex defect of a Cr oxide layer or a silicon nitride layer, which is a material of a halftone layer because a decrease of a transmission is not accrued.

Moreover, this method is also applicable to a convex defect or a concave defect of a transparent phase shifter mainly comprised of silicon oxide, e.g., SOG or such defects of silicon oxide layer formed by a liquid phase deposition.

Moreover, this method is useful for an X-ray mask having a layer containing silicon elements, because it does not cause a decrease of a transmission.

Thus, to lower the etching rate, the low gas pressure is used. This suppresses an effect of the focused ion beam apparatus and therefore the apparatus can be made stable for a long time.

A third embodiment will be described below. A photo mask 10, as in the second embodiment, is used. In addition, most of the steps in repairing a photo mask 10 are the same as in the second embodiment, except that an irradiation by a focused ion beam to remove a defect 20 of the mask 10 is performed without providing $XeF_2$, at first. The focused ion beam is used under the same conditions as in the second embodiment. As a result, the transmission is almost the same as in FIG. 7(a). The repaired portion of the defect 20 has damage, caused by the irradiation of an ion beam. In an exposure experiment using the repaired mask, an undesired resist pattern remained on a region corresponding to the defect.

However, when a 1.0 Torr of $XeF_2$ gas is supplied to the surface of the photo mask from a gas introducing means 52 shown in FIG. 4, and a focused ion beam having 20 pA of beam currents is irradiated on the repaired portion of the defect 20 after the first irradiation of the focused ion beam, a number of injected ions into the surface of the substrate can be reduced. Therefore, the transmission can be recovered by the second irradiation of the focused ion beam with a XeF gas. In the situation described above, an etching yield of the quartz substrate was 8, and the value is eleven times that of a case without any gas.

Figure 9:
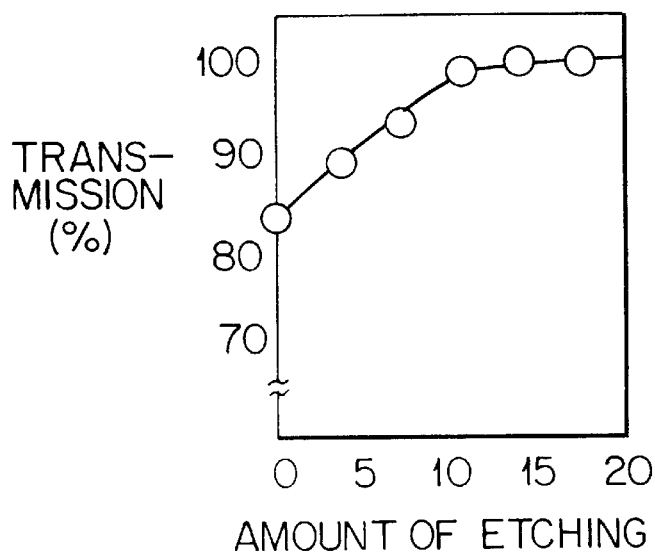
FIG. 9 is a graph which shows a relationship between an amount of etching and a transmission.

FIG. 9 is a graph showing a relationship between a transmission and an amount of etching of a region damaged by a focused ion beam.

In this graph, the transmission was recovered from an etching depth of 10 nm and was completely recovered at an etching depth of 15 nm.

Thus, by secondly irradiating the focused ion beam with very low beam currents of a focused ion beam and by slightly etching the repaired portion of the substrate after the first irradiation to the defect, an overetching with an etching gas 40 of the substrate can be greatly suppressed and a good transmission, such as shown in FIG. 7(c), can be obtained.

In an exposure experiment using a 1.2 $\mu$m-thick resist (PFR-IX500) and a i7A stepper (NA=0.5, $\sigma$=0.6), any undesired resist did not remain at a region corresponding to the repaired portion of the mask.

When a phase shifting mask formed on a quartz substrate is used as a mask and an i line is an exposure light, a 10 nm etching depth corresponds to, at most, 5° of phase shift amount. Accordingly, this method to repair such ion damage can be used.

This method is applicable to a mask having a mask pattern or a phase shifter made of materials, such as SiN or $SiO_2$, which is etched by $CF_4$ or $CHF_3$ etching gas plasma. Therefore, a deterioration of a pattern caused by a dependence of etching rate on an angle of an incident ion and an undesired etching of a reflecting preventing layer formed on the surface of the mask can be avoided.

Figure 10A:
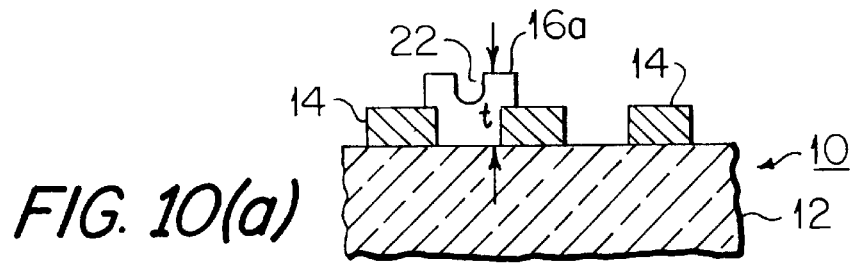
FIGS. 10(a) and 10(b) are sectional views of photo masks of the present invention.
Figure 10B:
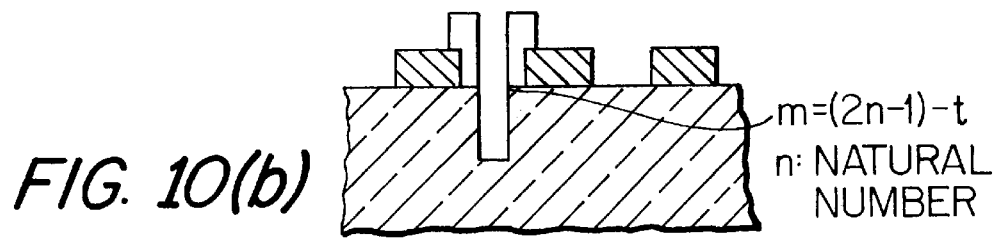

A fourth embodiment according to the present invention will be described below. The fourth embodiment is a method of repairing a concave defect 22 of a phase shifting mask 10 which has a shifter 16a made by depositing a silicon oxide, as shown in FIG. 10(a). In this fourth embodiment, an etching having a concave defect was performed under similar conditions of an etching gas and a focused ion beam as in the etching of the convex defect shown in FIG. 3(b). However, in FIG. 10(a), a shifter 22 or a quartz substrate 12 is etched to a certain depth which satisfies m=(2n−1) t (n: natural number, t: thickness of shifter), as shown in FIG. 10(b). That is, the etching depth m is determined such that a phase of exposure light, e.g., a 248 nm of KrF excimer laser which passes through the defect region is the same as a phase of a shifter of a designated thickness. In this embodiment, m is set to be equal to t. Experimentally, when the convex defect was repaired by a sole Ga ion beam sputter etching, a transmission was decreased to 60% after removal of the defect. However, according to the fourth embodiment, the transmission was kept to 99% and in an exposure experiment no pattern corresponding to the repaired portion was observed on a resist film.

Figure 11A:
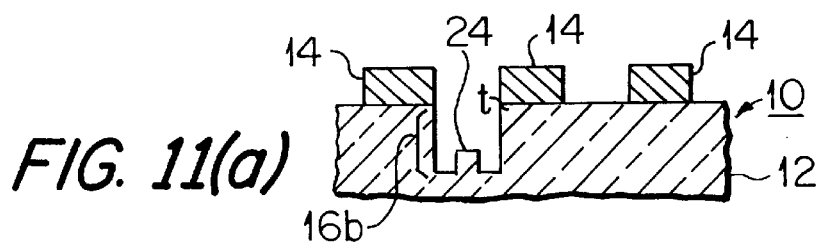
FIGS. 11(a) and 11(b) are sectional views of photo masks of the present invention.
Figure 11B:
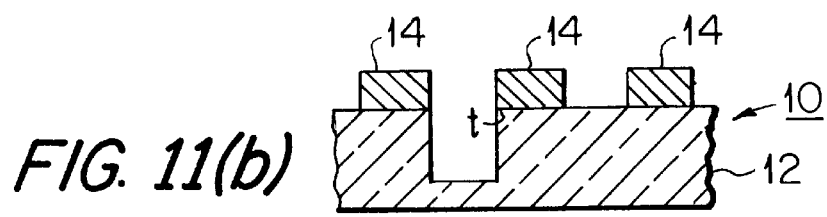

A fifth embodiment involves a method of repairing a defect of a phase shifting mask having a shifter, which is made by etching a quartz substrate. As shown in FIG. 11(a), the mask 10 has a quartz substrate 12 and a mask pattern 14 and a defect 24 formed on a shifter 16b. This defect is removed as shown in FIG. 11(b), in a manner similar to that of the previous embodiment.

Figure 12A:
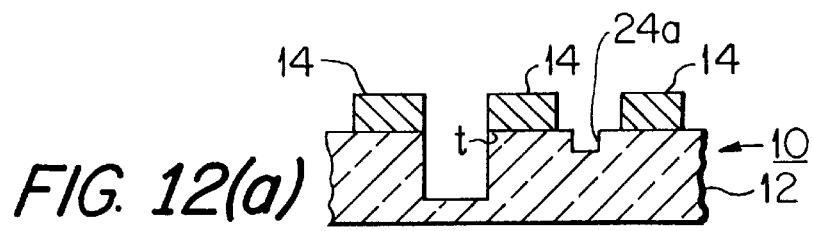
FIGS. 12(a) and 12(b) are sectional views of photo masks of the present invention.
Figure 12B:
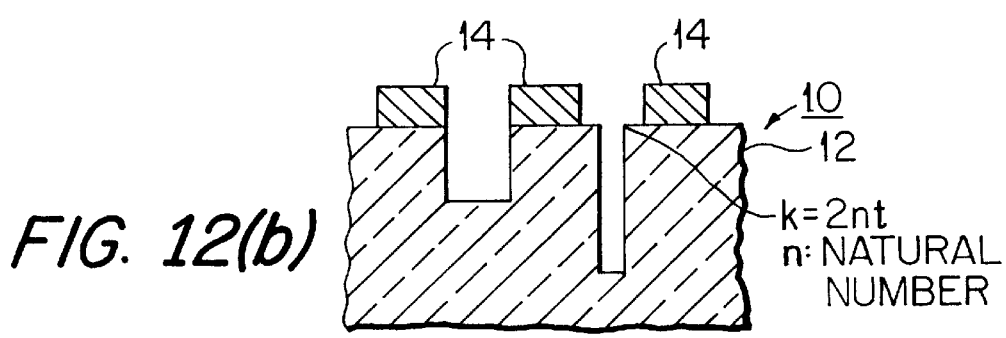

Also, as shown in FIG. 12(a), if there is a concave defect 24a on the quartz substrate 12, i.e., the portion not comprising a phase shifter, etching the defect portion would be performed by a focused ion beam with an etching gas, e.g., $XeF_2$, to a certain depth K which satisfies K=2nt (n: natural number, t=depth of phase shifter), shown in FIG. 12(b). $CHF_3$ also can be used as an etching gas instead of $XeF_2$ in these embodiments. Moreover, in these embodiments, a Levenson-type phase shifting mask is described, but a shifter edge type on a self-aligned type of phase shifting mask can also be applicable.

Next, a sixth embodiment of the present invention will be described below. The sixth embodiment involves a method of repairing a phase shifting mask having a shifter made of resist material.

Figure 13A:
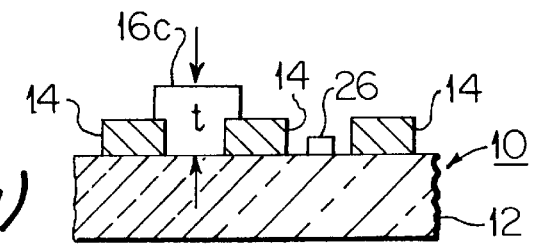
FIGS. 13(a), 13(b) and 13(c) are sectional views of photo masks of the present invention.
Figure 13B:
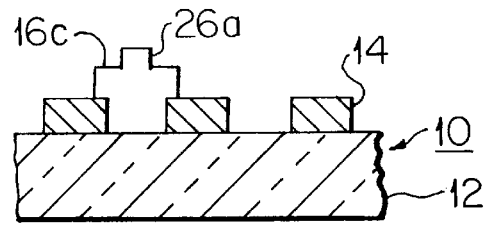

As shown in FIG. 13(a) and FIG. 13(b), a Levenson-type phase shifting mask 10 comprises a quartz substrate 12 and a Cr mask pattern 14 formed on substrate 12 and a phase shifter made of PMMA 16c. Convex defects 26, 26a are formed on the mask 10.

In this embodiment, a 370 nm of i line was used as an exposure light source. A thickness t of a phase shifter 16c needs to be an odd multiple of 370.0 nm. ±5% of error would be allowed and, in the embodiment, the thickness t was set to 307.0 nm.

In a case using a KrF laser having a wavelength of 248 nm, the thickness t should be an odd multiple of the wavelength.

Figure 13C:
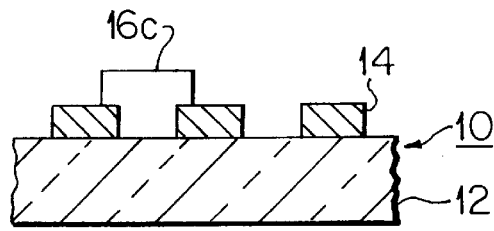

In the embodiment, a focused ion beam apparatus is used that is similar to that shown in FIG. 4. A 1.0 Torr of $O_2$ gas was used as an etching gas for the defects 26, 26a. When a Ga ion beam having 30 KV of accelerated voltage and 110 pA of beam currents is irradiated toward the defects 26, 26A, these defects 26, 26a are completely removed as shown in FIG. 13(c). An endpoint detection was performed in a manner similar to that of the first embodiment. This detection could be performed by monitoring secondary ions by using a multichannel plate 68, if the defect 26 is formed on quartz substrate 12, but not on shifter 16c.

In the example, these defects 26, 26A were 1.0 μm square and 370.0 nm thick. An etching rate of the PMMA resist, according to the embodiment, was 12.0 nm for one scan of the focused ion beam. Therefore, 31 scans were necessary for a 370.0 nm-thick resist.

When the defects 26, 26a were repaired by a Ga ion beam without introducing any etching gas, a transmission of a region where the Ga ion beam was irradiated was decreased to 70% when an i line was used as an exposure light and an undesired pattern corresponding to the repaired portion was formed on an exposed substrate.

However, according to the sixth embodiment, 99% of the transmission can be obtained and any undesired pattern is not projected on an exposed substrate.

Figure 14A:
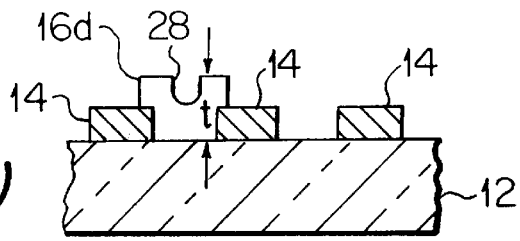
FIGS. 14(a), 14(b) and 14(c) are sectional views of photo masks of the present invention.
Figure 14B:
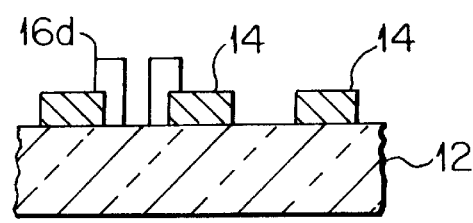
Figure 14C:
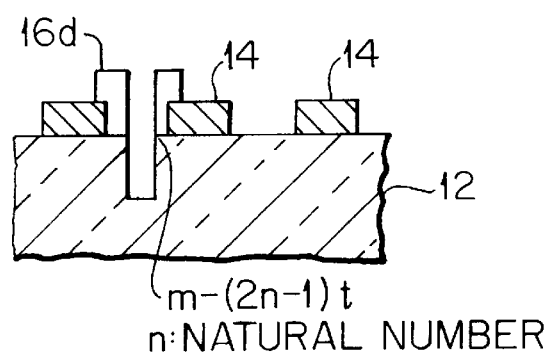

Next, a seventh embodiment of the present invention will be described. In the seventh embodiment, a structure of a phase shifting mask is similar to that of the above-described embodiment. The embodiments differ in that a concave defect 28 is formed on a phase shifter 16d, as shown in FIG. 14(a). In this case, first, a portion of a phase shifter 16d where a concave defect 28 is formed is etched by using a Ga ion beam supplying an $O_2$ gas, in a manner similar to that of the sixth embodiment. This etching is stopped if a surface of a quartz substrate 10 is exposed, as shown in FIG. 14(b). After this, $O_2$ gas is evacuated from the chamber 58 by using a turbo molecular pump TMP and then $XeF_2$ etching gas is introduced to etch a portion of a quartz substrate 12, the portion corresponding to the repaired portion.

Conditions of this etching using $XeF_2$ gas are similar to those of the first embodiment. An etching depth m, according to this etching, is defined by an odd multiple of a phase shifter thickness t. In other words, m should be determined to satisfy m=(2n−1) t, (n=natural number). In this embodiment, the depth m was set to 410.1 nm. In a case using a KrF excimer laser, the depth would be changed to, for example, 248 nm.

According to the embodiment, 99% of a transmission can be obtained and any undesired pattern corresponding to the repaired portion of the mask is not observed.

In the embodiment, a thickness of a PMMA resist layer is 370.0 nm, but if the thickness is 1110.0 nm, a 740.0 nm depth of etching for the PMMA resist layer can be performed without etching quartz substrate 12.

Also, in the sixth and seventh embodiments, $O_2$ gas was used as an etching gas, but another etching gas, e.g., $O_3$, $NO_2$, NO, $N_2$ could also be applicable.

A eighth embodiment of the present embodiment will be described below. The eighth embodiment involves a method of repairing a convex defect of a halftone-type, phase shifting mask.

Figure 15A:
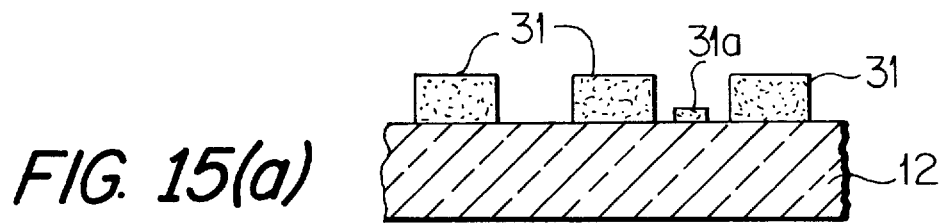
FIGS. 15(a) and 15(b) are sectional views of photo masks of the present invention.
Figure 15B:
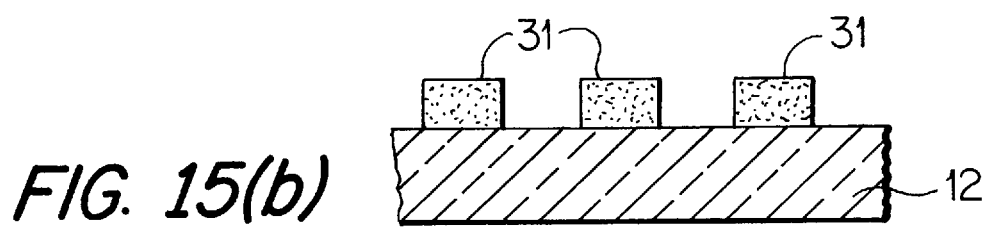

As shown in FIG. 15(a), a 58.0 nm-thick silicon halftone layer 31 is formed on a quartz substrate 12. Silicon half tone layer 31 has 1.7% of the transmission and functions as a phase shifter and a mask pattern at the same time. A phase of an exposure light, e.g., g line is shifted by 180° according to this layer 31. A convex defect 31a is formed on this phase shifting mask, such as on quartz substrate 12.

In this embodiment, the phase shifting mask is placed on a holder 56 in a focused ion beam apparatus, as shown in FIG. 4. A 1.0 Torr of $Cl_2$ gas is introduced into a chamber 58 and a Ga ion beam having a 30 KV accelerated voltage and a 110 pA beam currents is irradiated toward the convex defect 31a. An endpoint detection is made by monitoring secondary ions coming from quartz substrate 12. That is, the end point is defined by exposing the surface of the substrate 12 according to the focused ion beam etching.

This endpoint detection can be performed by examining a configuration or a light of a convex defect 31a, and dividing the defect 31a into small regions and determining an amount of the irradiation to reach such regions by calculating an etching rate.

In a case using a Ga ion beam without any etching gas, a transmission by i line of the repaired portion was decreased to 75% after removal of a defect 31a and an undesired pattern was projected on an exposed substrate.

However, according to the embodiment of the present invention, 99% of the transmission can be obtained and any undesired pattern corresponding to the repaired portion of the phase shifting mask is not projected.

Figure 16A:
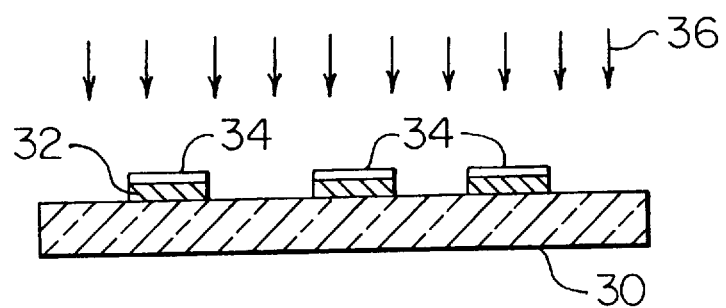
FIGS. 16(a) and 16(b) are sectional views of photo masks of the present invention.

A ninth embodiment of the present invention, which provides a method and a phase shifting mask to easily detect an endpoint of etching when the mask is repaired, is discussed below. FIG. 16(a) shows a sectional view of a phase shifting mask according to the ninth embodiment. As shown in FIG. 16(a), a mask pattern comprising a stacked Cr layer 32 and $CrO_2$ layer 34 formed on a quartz substrate 30 is formed and 20 KeV of Ar ions 36 is implanted into the surface of a quartz substrate 30. A range-energy of an Ar ion was about 20 nm and therefore Ar ions 36 existed near the surface of the substrate. A dose of an Ar ion was $1\times10^{11}/cm^2$. After this Ar ion implantation, a transmission of spectral diffraction was measured, and the transmission was almost the same as that without any ion implantation. Therefore, a decrease of a transmission can be negligible.

Figure 16B:
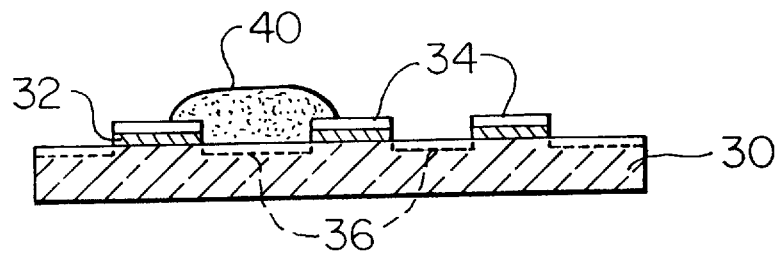

Next, as shown in FIG. 16(b), a resist film is coated on the surface of the quartz substrate 30 and is exposed by, e.g., an electronic beam exposure and a 224 nm-thick resist pattern 40 is formed as a phase shifter.

Figure 17A:
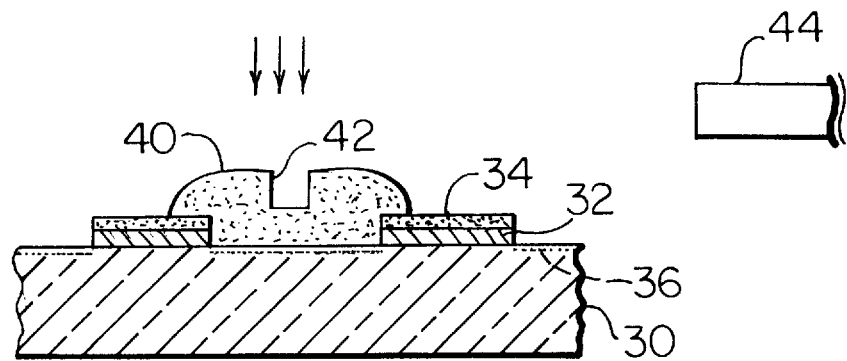
FIGS. 17(a), 17(b) and 17(c) are sectional views of photo masks of the present invention.

If the phase shifting mask has a concave defect 42 of a phase shifter 40 shown in FIG. 17(a), this defect 42 could be repaired by using a focused ion beam apparatus shown in FIG. 4, as follows.

A 30 KeV of a Ga ion beam is irradiated toward the defect 42, supplying $XeF_2$ etching gas to etch the defect 42 deeply. This etching is performed to detect secondary ions from the etching mask by using a secondary ion detector 44.

Figure 17B:
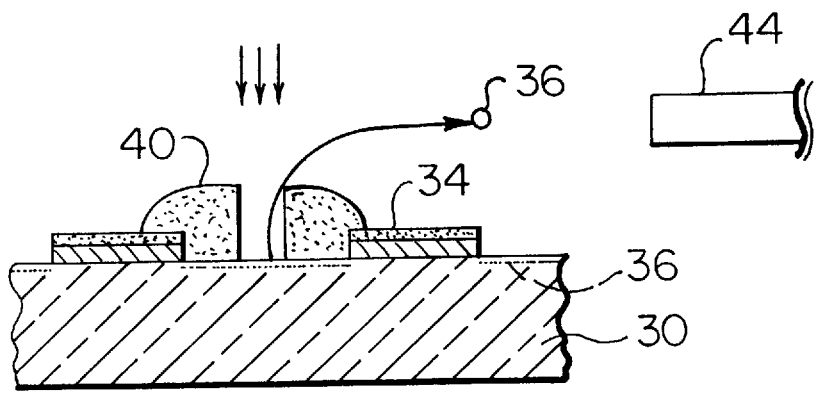
Figure 17C:
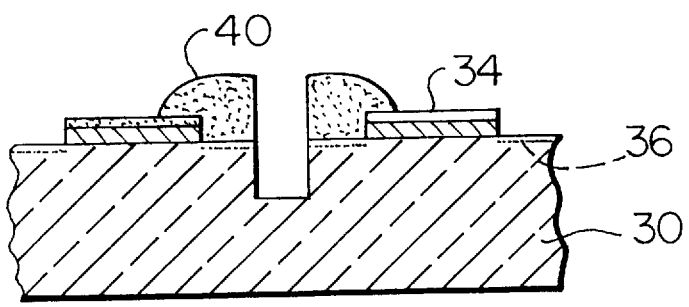

If the etching continues, the surface of quartz substrate 30 is exposed as shown in FIG. 17(b). An Ar ion 36 existent at the surface of the substrate 30 is detected by a secondary ion detector 44. Thus, the surface of the quartz substrate 30 can be recognized. After this detection of the surface of the quartz substrate 30, an etching to the substrate 30 is continued for about 30 seconds (shown in FIG. 17(c)). An etching time is determined by an etching rate of a quartz substrate and an etching depth so that the etching depth can shift a phase of an exposure light, e.g., a 248 nm KrF laser, by 180°.

Thus, by detecting the surface of the substrate 30 accurately, a defect formed on a shifter 40 can be repaired with high accuracy.

In the ninth embodiment, a Levenson-type phase shifting mask is described. However, this method can be applicable to other types of photo masks. For example, in a phase shifting mask making use of the edge, which has a mask pattern as a shifter, an effect similar to that explained above can be obtained by implanting Ar ions to the surface of the quartz substrate and forming a shifter on the quartz substrate. Moreover, an implanted ion is not limited to an Ar ion but can be another kind of ion.

A tenth embodiment of the present invention will be explained below. This embodiment is a method of repairing a concave defect of a photo mask, such as a phase shifting mask. This method deposits silicon oxide into the concave defect by irradiating a low energy focused ion beam, having a diameter smaller than 0.1 μm, toward the defect.

Figure 18:
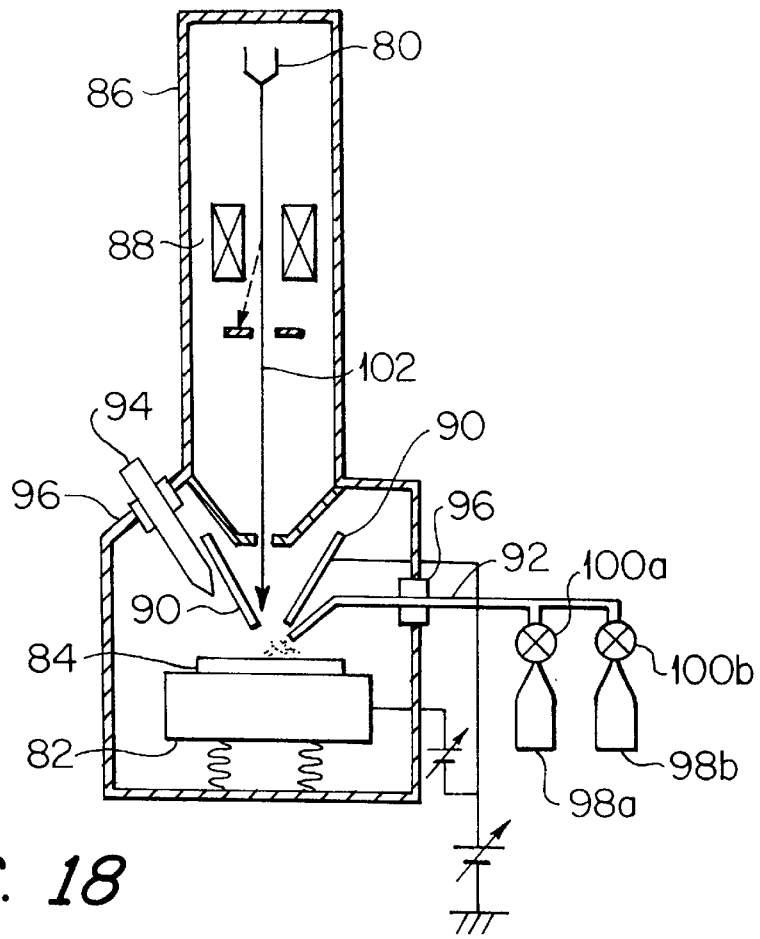
FIG. 18 is a schematic sectional view of a focused ion beam apparatus used in the present invention.
Figure 19:
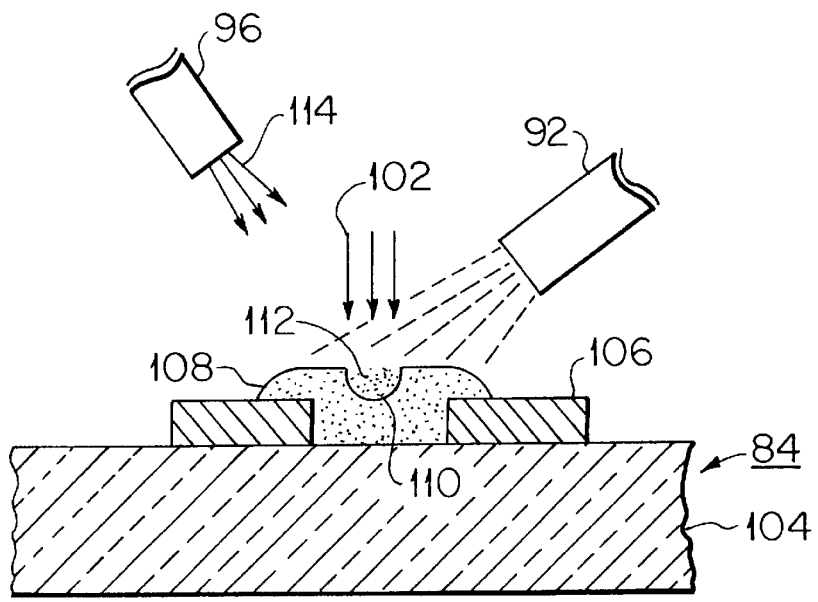
FIG. 19 is a magnified view of FIG. 18.

In the tenth embodiment, in order to attain a small beam diameter, even with low energy, such as an energy smaller than 10 keV, a low energy focused ion beam apparatus shown in FIG. 18 is used. In the apparatus, an ion beam 102 from an ion source 80 in an ion optical system 86 has a 30 kV of accelerated voltage and a potential at a holder 82 is set to 29 kV. Therefore, an ion energy irradiated toward a phase shifting mask 84 is decreased to about 1 keV at the surface of the mask 84 and the ion beam has a 0.1 μm of diameter.

In the embodiment, an AuSi ion source is used, and an Si ion beam selected by a mass separator 88 is irradiated.

The ion beam is focused on the defect by using an ion beam controlling system, e.g., an objective lens. Retarding electrodes 90 are provided over the phase shifting mask 84 in order to shield an electric field and to suppress an effect by an electrical change by the ion irradiation. Retarding electrodes 90 are kept to the same potential as the mask 84 and, in accordance with retarding electrodes 90, the focusing condition of an ion beam can be improved.

A holder 82, a gas introducing means 92, and a charge neutralizer 94, which is used for preventing a buildup of charge on the surface of the mask 84 by irradiating electrons to the mask 84, are isolated by insulating materials 96, such as a silicon oxide. Gas is introduced from a gas source 98a, 98b through valves 100a, 100b.

Phase shifting mask 84 comprises a quartz substrate 104 and a Cr mask pattern 106 formed on a substrate 104 and a silicon oxide shifter 108. A concave defect 110 is formed on the shifter 108.

Repair of the phase shifting mask 84 is performed as described below. Mask 84 is placed on a holder 82 and then Si(OCH$_3$)$_4$ from a gas source 98a and O$_2$ gas from a gas source 98b are supplied as a gas mixture toward a defect 110 of mask 84. A 1 KeV irradiating energy of an Si ion beam 102 is irradiated toward the defect 110, and not irradiated to another portion of mask 84. Thus, a silicon oxide film 112 is deposited into the concave defect 110 for repairing the defect 110. During the deposition, a buildup of charge of the mask 84 is prevented by irradiating an electron beam 114 from a charge neutralizer 96.

A transmission of a 300 μm-thick silicon oxide layer deposited by the above process was 95% of 436 μm of the g line. A refractive index of the layer 112 deposited was slightly smaller than that of a shifter 108. However, this is within tolerable repair limits.

Also, a transmission is decreased to 90% when a 10 keV of an irradiating energy is used and is decreased to 60% when a 20 KeV of an irradiating energy is used. This means that a higher energy ion beam causes much damage to the repaired portion.

Accordingly, if a focused ion beam, e.g., a Si ion beam having an irradiating energy smaller than 10 KeV is used, a transmission more than 90%, which is required for the repair, can be obtained.

When a silicon nitride layer is used as a phase shifter, Si(OCH$_3$)$_4$ and NH$_3$ gases can be used to form a silicon nitride layer into a concave defect. Besides a silicon oxide layer or silicon nitride layer, this method can be applicable to the other material.

Figure 20:
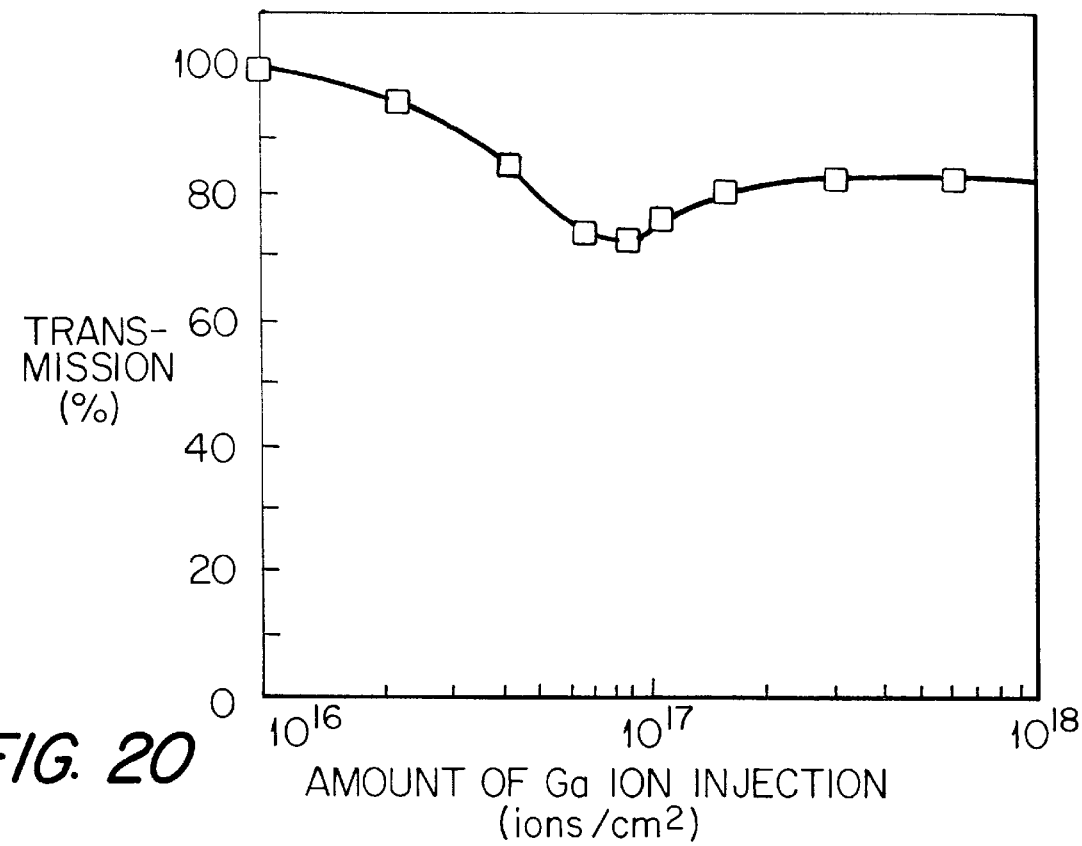
FIG. 20 is a graph which shows a relationship between an ion dose and a transmission.

An eleventh embodiment of the present invention is described below. According to a study by the inventors, a transmission of a transparent substrate in a photo mask is saturated at a certain value, to an amount of an ion dose. FIG. 20 is a graph which shows a relationship between an amount of a Ga ion injection and a transmission of a transparent substrate of a photo mask. A Ga focused ion beam is irradiated on the transparent substrate with a 30 kV of accelerated voltage.

As is apparent from the graph, a transmission gradually decreases to 70% with an increase of dose to about 9×10$^{16}$ ions/cm$^2$. But when the ion dose is more than 10$^{17}$ ions/cm$^2$, the transmission gradually increases and levels off to about 80%.

In the embodiment, ions are injected into the transparent substrate to form a half transparent layer at the surface of the substrate before repairing the mask. Therefore, if an ion density of a repaired portion irradiated by a focused ion beam is increased, the transmission factor is already saturated so the transmission over the transparent region can be kept uniform.

Figure 21A:
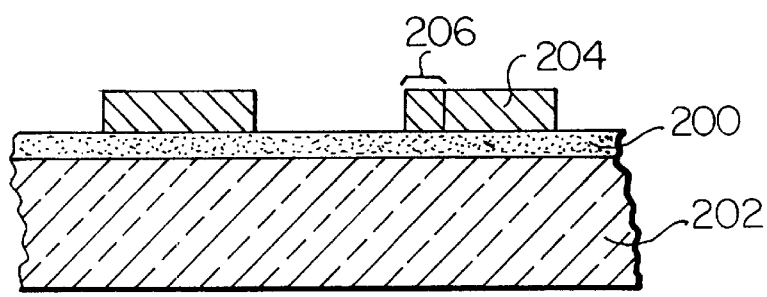
FIGS. 21(a), 21(b) and 21(c) are graphs which show a distribution chart of a transmission after repair according to the present invention.
Figure 21B:
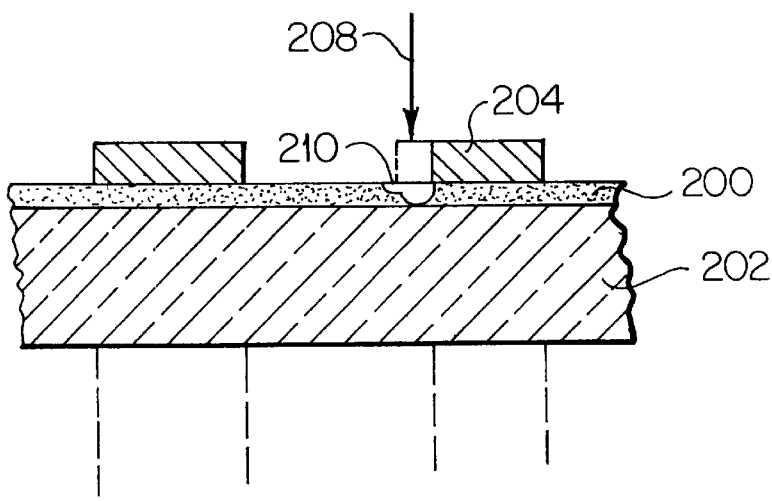

FIG. 21(a) and FIG. 21(b) are sectional views explaining the eleventh embodiment of the present invention. As shown in FIG. 21(a), a Levenson-type phase shifting mask has a half-transparent layer 200 formed on a silicon oxide substrate 202 as a transparent substrate and a Cr mask pattern 204 also formed on the substrate 202. A half-transparent layer 200 is formed by an ion implantation, such that a transparent becomes saturated to a certain value, e.g., to 80%, before a Cr mask pattern 200 is formed.

In FIG. 21(a), a Cr mask pattern 200 has a defect 206, which is not designated as a pattern and should be removed.

Figure 21C:
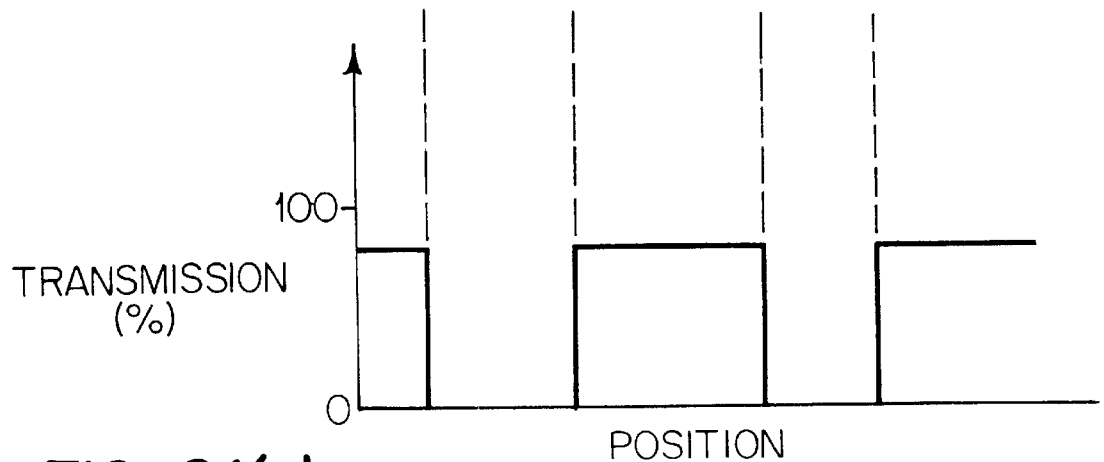

This defect 206 can be removed by using a focused ion beam. That is, as shown in FIG. 21(b), a focused ion beam 208 is irradiated toward the defect 206 and the defect 206 is removed. After irradiation, the damage 210 by the focused ion beam 208 is formed at the surface of the transparent substrate 202, that is, within the half-transparent layer 200. Therefore, the transmission is not decreased. FIG. 21(c) shows a distribution chart of a transmission of this mask. As is apparent from FIG. 21(c), the transmission is slightly smaller but the transmission in the overall region where an exposure light passes through is constant or uniform even in the repaired region.

According to this embodiment, a photo mask that has a uniform to transmission, can be obtained without using an etching gas as in the embodiments described above.

In addition, because the transmission is uniform, by relatively increasing an exposure amount, an ideal distribution chart of transmission factor can be obtained.

Figure 22:
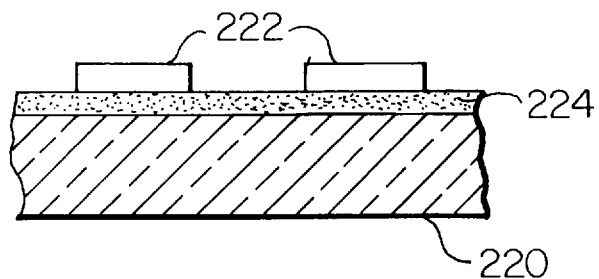
FIG. 22 is a sectional view of the photo masks of the present invention.

This embodiment is not limited to a Levenson-type phase shifting mask, and the other types of photo masks can be applicable. As shown in FIG. 22, for example, a halftone-type phase shifting mask which has a half tone layer 222 formed on a transparent substrate 200 can be used in the embodiment. The halftone layer 222 functions as a mask pattern and a phase shifter. And a half-transparent layer 224 is formed in a manner similar to that of the eleventh embodiment.

Figure 23:
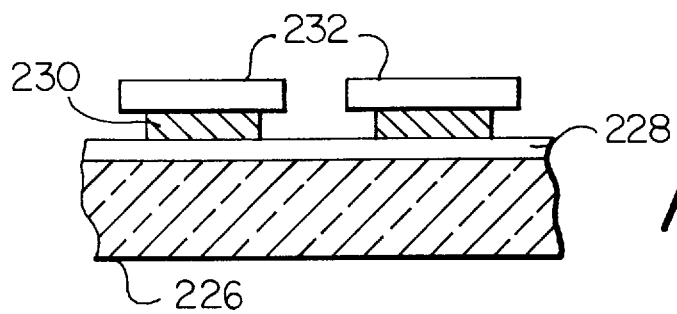
FIG. 23 is a sectional view of the photo masks of the present invention.

Also, as shown in FIG. 23, a self-alignment-type phase shifting mask can be used. The self-alignment-type phase shifting mask has a mask pattern 230 formed on a transparent substrate 226 and a phase shifter 232 formed on a mask pattern 230 so as to be overhang, i.e., to jut out from the edge portion of a mask pattern 230. A half-transparent layer 228 is formed in a similar way to that of the eleventh embodiment.

In other words, a transparent layer according to the embodiment is formed in a photo mask, which may receive some damage because of irradiation of a focused ion beam for repairing a defect of the photo mask.

An injected ion is not always the same as an ion of a focused ion beam. An important point is that injected ions existed so as to saturate a decrease of a transmission.

Figure 24:
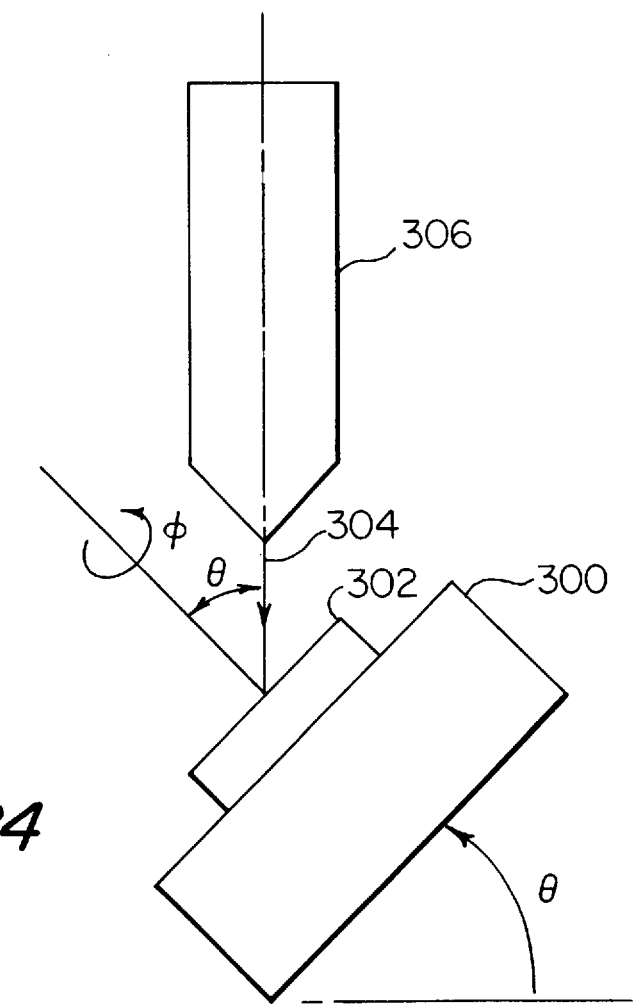
FIG. 24 is a schematic sectional view of a focused ion beam apparatus according to the present invention.

A twelfth embodiment of the present invention will be described below. FIG. 24 shows a schematic sectional view of a focused ion beam apparatus of the embodiment.

In FIG. 24, a mask 302 is placed on a mask holder 300, which is able to change an angle relative to a direction of a focused ion beam 304. A focused ion beam 304 is irradiated from a beam generating and focusing system 306. When the mask 302 is placed on the holder 300, the holder 300 is kept horizontal. When the focused ion beam 304 is irradiated to the mask 302, the holder 300 is inclined by a certain degree angle θ to the direction of a focused ion beam 304.

Figure 25:
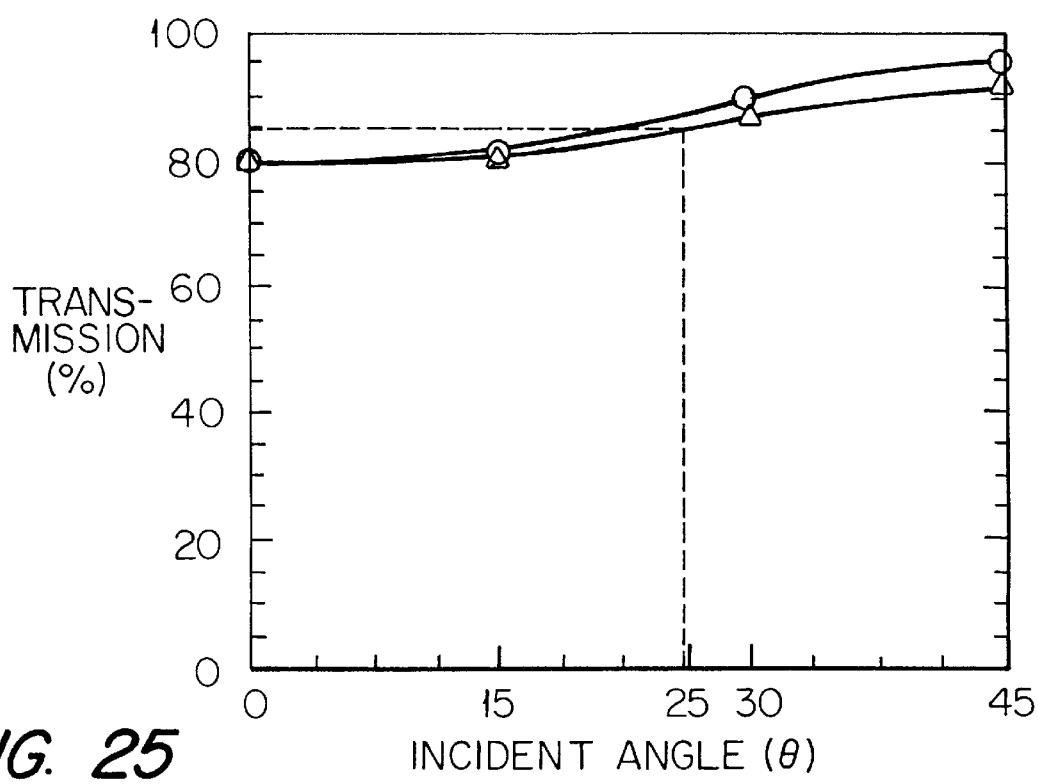
FIG. 25 is a graph which shows a relationship between an ion incident angle and a transmission.

FIG. 25 shows a relationship between a transmission factor and an incident angle θ of focused ion beam 304. As sample materials, a glass (silicon oxide) substrate and a glass substrate coated by Cr layer, are respectively examined. As a result, as shown in FIG. 25, when the angle θ is more than 30°, the transmission is improved to about 90% in both cases. And when the angle θ becomes 45°, the transmission is almost the same as when a focused ion beam is not irradiated.

For example, as shown in a dotted line in FIG. 25, in a case of a transparent substrate coated by a CR layer, 85% of the transmission can be obtained at 25°. Therefore, in this case, the angle θ should be more than 25°. However, it is difficult to change the angle of the holder 300 greatly because of a structural design of the apparatus. Therefore, the angle θ might be determined to be a minimum angle, which can obtain a necessary transmission.

Figure 26:
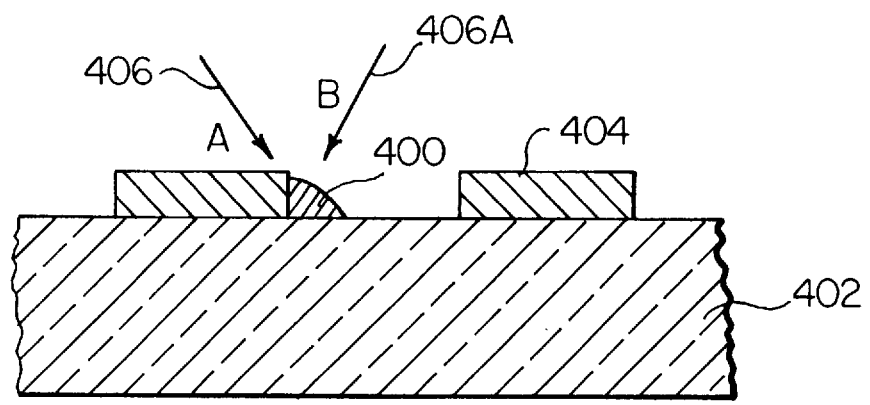
FIG. 26 is a sectional view of the photo masks of the present invention.

Also, as shown in FIG. 26, when a convex defect 400 of a mask pattern 404 is formed on a transparent substrate 402, if a focused ion beam 406 is irradiated from a direction A, a part of a mask pattern 400 is sputtered and a new defect might be formed. To avoid this situation, in the focused ion beam apparatus, mask holder 300 can be rotated. Accordingly, the holder 300 is rotated to a desired angle θ, perpendicular to a direction of the mask 302. Then, a focused ion beam 406a from a desired direction B can be supplied to a defect 400 and the defect 400 can be removed effectively, without damaging a mask pattern 404 or a transparent substrate 402.

It is also possible to design an apparatus such that a beam generating and focusing system 306 is relatively inclined to mask holder 300.

Figure 27:
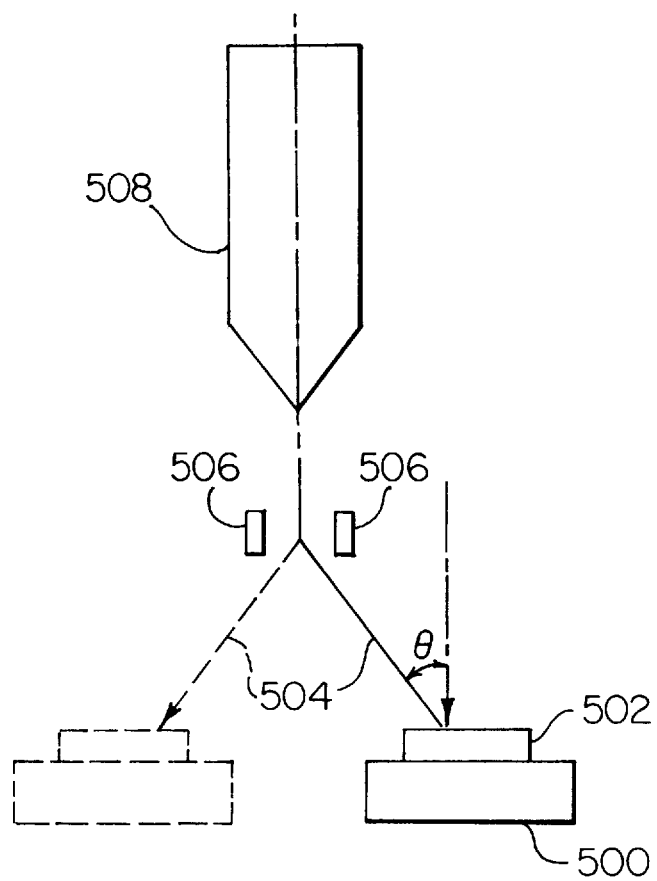
FIG. 27 is a schematic sectional view of a focused ion beam apparatus according to the present invention.

FIG. 27 shows another embodiment of a focused ion beam apparatus according to the present invention. In this figure, a mask holder 500 and a mask 502 placed on the mask holder 500 are provided perpendicular to a direction of a focused ion beam irradiation.

An incident angle θ of the a focused ion beam 504 toward the mask 502 is controlled by a pair of deflectors 506, which are provided between an ion beam generator 508 and a mask holder 500. The mask holder 500 can be rotated. According to this apparatus, a focused ion beam can be suppled toward a desired portion, e.g., a defect being repaired and the defect can be properly removed.

Numerous modifications and variations of the present invention are possible in light of the above teachings. It is therefore understood that, within the scope of the appended claims, the present invention can be practiced in a manner other than as specifically described herein.

What is claimed is:

1. A method of repairing a concave defect existing on a photo mask having a transparent substrate and a mask pattern formed on the substrate, comprising the steps of:
   irradiating a focused ion beam toward the concave defect, with an accelerated energy less than 10 keV at the surface of the mask; and
   supplying a deposition gas to the concave defect to form a deposition layer in the defect.

2. A method according to claim 1, wherein the photo mask further comprises a phase shifter, which phase shifts at exposure to light.

3. A method according to claim 2, wherein the deposition layer is made of the same material as a phase shifter.

4. A method according to claim 2, wherein the phase shifter is made of a silicon oxide and $Si(OCH_3)_4$ gas and $O_2$ gas is used as a deposition gas.

5. A photo mask comprising:
   a transparent substrate having a primary surface;
   a phase shifter, which is made of a same material as the transparent substrate and is formed on the transparent substrate and which phase shifts in response to an exposed light used for the photo mask; and
   an ion implanted layer formed at the primary surface, the implanted ions including Ga ions, said implanted ions being different from elements which form the transparent substrate.

6. A photo mask comprising:
   a transparent substrate;
   a half-transparent layer formed on the substrate by injecting ions, including Ga ions, into the substrate until a transmission becomes a constant; and
   a mask pattern formed on the half-transparent layer.

7. A photo mask according to claim 6, further comprising a defect formed on the photo mask.

8. A method of repairing a defect existing on a photomask, comprising a transparent substrate and a phase shift pattern made of silicon oxide, comprising the steps of:
   irradiating a focused ion beam toward the defect; and
   supplying $XeF_2$ gas, under a condition that an etching rate of the defect by the focused ion beam and said $XeF_2$ gas is greater than 1.7 times an etching rate by a sole irradiation of the focused ion beam.

9. A method according to claim 8, wherein the defect has a concave shape.

10. A method according to claim 8, wherein the defect has a convex shape.

11. A method according to claim 8, further comprising the steps of:
    measuring a configuration and a height of the defect; and
    determining an amount of beam irradiation for a plurality of regions of said defect in accordance with said etching rate of the defect and an etching rate of the substrate, based on the amount of the $XeF_2$ gas.

12. A method of repairing a convex defect existing on a photomask, comprising a transparent substrate and a mask pattern formed on the substrate, comprising the steps of:
    irradiating a focused ion beam toward the defect;
    supplying $XeF_2$ gas, under a condition that an etching rate of the defect by the focused ion beam and the $XeF_2$ gas is greater than 1.7 times an etching rate by a sole irradiation of the focused ion beam.

13. A method according to claim 12, wherein the mask pattern and the defect include a first material selected from a group of a non-transparent substance and a phase shift mask which shifts a phase of an exposure light by a predetermined degree.

14. A method according to claim 13, wherein the phase shift mask further comprises a half-transparent layer.

15. A method according to claim 14, wherein the half-transparent layer includes a second material selected from a group of chromium oxide or silicon oxide.

16. A method according to claim 14, further comprising the steps of:

detecting a signal corresponding to the defect to be removed; and following said detecting step, controlling an etching rate of the substrate to prevent formation of a dark portion when the focused ion beam irradiation is completed.

17. A method according to claim 16, wherein the control of etching rate is performed by adjusting a pressure of said etching gas.

18. A method according to claim 13, wherein the phase shift mask further comprises a transparent layer.

19. A method according to claim 13, wherein the phase shift mask includes silicon oxide.

20. A method according to claim 19, wherein said silicon oxide is selected from a group of a spin on glass, a quartz substrate, and an oxide manufactured by a liquid phase deposition.

21. A method according to claim 19, wherein the silicon oxide is selected from a group of spin on glass, a quartz substrate, and an oxide manufactured by a liquid phase deposition.

22. A method of repairing a defect existing on a phase shift mask made of organic material and provided on a transparent substrate, comprising the steps of:

irradiating a focused ion beam toward the defect;

supplying a gas selected from a group of $O_2$, $O_3$, NO, $NO_2$, $N_2$.

23. A method according to claim 22, further comprising the step of:

after said steps of irradiation of the focused ion beam and supplying said gas, etching the transparent substrate by using a focused ion beam and $XeF_2$.

24. A method of repairing a defect existing on a photo mask having a transparent substrate and a mask pattern formed on the substrate, comprising the steps of:

irradiating a focused ion beam to remove the defect; and supplying an etching gas for etching a damaged surface of the transparent substrate after irradiation of said focused ion beam.

25. A method according to claim 24, wherein said etching gas includes $XeF_2$ gas.

26. A method according to claim 24, wherein the etching gas is selected from $F_2$, $Cl_2$, $Br_2$.

27. A method according to claim 24, wherein the mask pattern and the defect include a phase shift mask which shifts a phase of an exposure light by predetermined degree.

28. A method according to claim 24, wherein the phase shift mask comprises a half-transparent layer.

29. A method according to claim 24, wherein the phase shift mask comprises a transparent layer.

30. A method according to claim 24, wherein the phase shift mask includes silicon oxide.

31. A method according to claim 30, wherein the half-transparent layer is selected from a group of chromium oxide and silicon oxide.

32. A method according to claim 24, wherein said damaged surface is etched under a condition that an etching rate of the defect by the focused ion beam and said $XeF_2$ gas is greater than 1.7 times an etching rate by a sole irradiation of the focused ion beam.

33. A method according to claim 24, further comprising the steps of:

detecting a signal corresponding to said defect; and following said detecting of said signal, controlling an etching rate of the substrate to prevent formation of a dark portion on said substrate when the focused ion beam irradiation is completed.

34. A method according to claim 24, wherein the control of the etching rate is performed by adjusting an amount of a beam irradiation of the focused ion beam.

35. A method according to claim 24, further comprising the steps of;

measuring a configuration and a height of the defect; and determining an amount of beam irradiation for a plurality of regions of said defect in accordance with said etching rate of the defect and an etching rate of the substrate, based on amount of the gas.

36. A method according to claim 24, wherein the depth of etching against the transparent substrate is more than 10 nm.

37. A method according to claim 24, wherein the photomask includes a phase shifter, which phase shifts an exposure light by 180 degrees.

38. A method according to claim 37, wherein the phase shifter includes a silicon containing material and said etching gas includes a gas selected from the group of a fluorine containing gas, a chlorine containing gas, and a bromine containing gas.

39. A method according to claim 37, wherein the phase shifter includes an organic material and said etching gas includes a gas selected from the group of $O_2$, $O_3$, NO and $NO_3$.

* * * * *

UNITED STATES PATENT AND TRADEMARK OFFICE
CERTIFICATE OF CORRECTION

PATENT NO.: 5,807,650

DATED: September 15, 1998

INVENTOR(S): Komano et al.

It is certified that an error appears in the above-identified patent and that said Letters Patent is hereby corrected as shown below:

Claim 35, column 16, line 31, delete "of;" and insert --of:--.

Signed and Sealed this

Twenty-fifth Day of January, 2000

Attest:

Attesting Officer

Acting Commissioner of Patents and Trademarks